US009829518B2

(12) United States Patent
Brooks et al.

(10) Patent No.: US 9,829,518 B2
(45) Date of Patent: Nov. 28, 2017

(54) ADAPTIVE RF SIGNAL FILTER USING ACOUSTO-OPTIC SPECTRUM ANALYZER AND RE-WRITABLE XDM MASK

(71) Applicant: Loki Systems LLC, Vancouver, WA (US)

(72) Inventors: William M. Brooks, Scotts Valley, CA (US); Frederick N. Magee, Vancouver, WA (US)

(73) Assignee: Loki Systems LLC, Vancouver, WA (US)

( * ) Notice: Subject to any disclaimer, the term of this patent is extended or adjusted under 35 U.S.C. 154(b) by 949 days.

(21) Appl. No.: 14/189,160

(22) Filed: Feb. 25, 2014

(65) Prior Publication Data

US 2014/0257758 A1    Sep. 11, 2014

Related U.S. Application Data

(60) Provisional application No. 61/768,716, filed on Feb. 25, 2013.

(51) Int. Cl.
*G01R 23/17* (2006.01)
(52) U.S. Cl.
CPC .................. *G01R 23/17* (2013.01)
(58) Field of Classification Search
CPC ..................................... G01R 23/17
USPC ......................................... 250/368
See application file for complete search history.

(56) References Cited

U.S. PATENT DOCUMENTS

| 4,645,300 A * | 2/1987 | Brandstetter | G02B 27/46 359/285 |
|---|---|---|---|
| 4,757,472 A * | 7/1988 | Magee | G11B 11/00 365/120 |
| 5,032,002 A * | 7/1991 | Fonneland | G02B 27/46 349/1 |
| 5,128,693 A * | 7/1992 | Tatemichi | G11B 7/0065 347/239 |
| 5,146,358 A * | 9/1992 | Brooks | H04B 10/142 359/305 |
| 2004/0042727 A1* | 3/2004 | Aleksoff | G02B 6/02095 385/48 |
| 2006/0120730 A1* | 6/2006 | Drentea | H04B 1/28 398/201 |
| 2008/0130430 A1* | 6/2008 | Minabe | G11B 7/0065 369/44.23 |

(Continued)

Primary Examiner — David Porta
Assistant Examiner — Gisselle Gutierrez
(74) Attorney, Agent, or Firm — George C. Rondeau, Jr.; Davis Wright Tremaine LLP

(57) ABSTRACT

A coherent wideband acousto-optic RF spectrum analyzer for processing an input RF signal, having a CW laser providing a first laser beam, a Bragg cell used in a deflection mode with the laser beam incident thereon and receiving the input RF signal, and in response thereto producing multiple diffracted modulated light beams, a Fourier Transform lens with the modulated light beams incident thereon and in response thereto producing optical signal beams producing a Fourier Transform image in an image plane spaced apart from the Fourier Transform lens, and a photosensitive, optically re-writable medium positioned in the image plane with the optical signal beams incident thereon, the medium having an optical distribution pattern to function as a mask to attenuate a selected portion of the RF spectrum of the optical signal beams and produce an attenuated optical beam.

14 Claims, 2 Drawing Sheets

(56) References Cited

U.S. PATENT DOCUMENTS

2014/0241729 A1* 8/2014 Brooks .............. H04B 10/2575
  398/115
2016/0226215 A1* 8/2016 Podoleanu ............ H01S 3/1109

* cited by examiner

ADAPTIVE RF SIGNAL FILTER USING ACOUSTO-OPTIC SPECTRUM ANALYZER AND RE-WRITABLE XDM MASK

CROSS REFERENCE TO RELATED APPLICATION(S)

This application claims the benefit of U.S. Provisional Patent Application No. 61/768,716, filed Feb. 25, 2013, the contents of which are hereby incorporated by reference in its entirety.

BACKGROUND OF THE INVENTION

Field of the Invention

The present invention provides a means of extending the flexibility of a coherent acousto-optic RF spectrum analyzer architecture that can provide rapid and flexible minimization of interfering signals in near real time by using an optical architecture that can provide adaptive filtering, and provides an adaptive wideband acousto-optic RF signal processing system.

Description of the Related Art

Many EW (electronic warfare) and ESM (electronic support measure) systems receive and attempt to process wide bandwidth portions of the RF spectrum seeking to capture Signals of Interest (SOI). Often, these SOI have wide instantaneous bandwidth parameters, such as spread spectrum radar and communications signals, but many are also frequency agile, rapidly changing their RF frequency parameters. It is also common for EW and ESM systems to encounter interfering signals that obscure the parameters of the SOI. Often these interfering signals are intentionally generated to obscure the SOI, and often these interfering signals are themselves complex wideband signals of rapidly changing parameters.

A common method of reducing the effects of interfering signals is to employ an adaptive filter to block out interfering signals from the received RF spectrum being processed by the EW or ESM system. The adaptive filter may use frequency, Angle of Arrival (AOA), or Time of Arrival (TOA) information to develop the adaptive filtering parameters. In the simplest case, the interfering signal is a CW emitter that can simply be minimized by a narrow bandwidth band-reject "notch" filter, often performed by a Least Means Squared (LMS) algorithm in an accompanying DSP (Digital Signal Processing) signal processing subsystem in the EW or ESM system. In a dense signal environment, e.g., the European theater at 30,000 feet with a typical EW or ESM Field of View (FOV), the number of interfering signals increases dramatically. Multiple "notch" filters within the same spectrum sample become increasingly complex and difficult to create without causing additional intermodulation interfering (false) signals and accompanying distortion of the SOI. Wide bandwidth and complex interfering signals are also difficult to minimize since they have multiple frequency components within the RF spectrum of interest, and may be agile, requiring the adaptive minimization of interfering signals.

It is known that a coherent acousto-optic RF spectrum analyzer provides a wide instantaneous bandwidth Fourier Transform image of an input RF spectrum, i.e., the acousto-optic Bragg cell serves as a spatial light modulator (SLM) that accepts a wideband RF signal containing all signals within the RF spectrum of interest, and creates a spatially distributed one-dimensional optical image of the RF spectrum. Bragg cell based acoustic optic spectrum analyzers achieving more than 1 GHz instantaneous RF bandwidth and greater than 40 dB SFDR (Spurious Free Dynamic Range) have been demonstrated, and provide enough signal processing performance to be useful in EW and ESM applications. The acousto-optic SLM diffracts an incoming LASER beam into multiple first order diffracted beams, each first order diffracted beam corresponding to an RF signal present in the RF input spectrum. A Fourier lens is located one focal length from the Bragg cell, in the object plane to capture the first order diffracted beams, and then performs the complex Fourier Transform of the beams to create a one-dimensional line image of the frequency domain (RF spectrum) at the image plane located one focal length behind the Fourier lens. Past constructions of this architecture used multiple photodetectors ("linear arrays") arranged along this one-dimensional line image to detect the optical signals and transduce them back to the original RF signals, with each photodetector capturing a portion of the RF spectrum determined by the spatial width dimensions of the photodetector's active area. This architecture provides a means for creating a "channelized receiver" that can minimize interfering signals by choosing to ignore the signal outputs from those photodetectors that represent interfering signals. However, the "channelized received" lacks the flexibility to adapt to varying interfering signal bandwidths and more complex wide bandwidth signals that often occupy more than one photodetector's portion of the spectrum, as the optics and the photodetector dimensions are fixed variables and therefore not conducive to adaptive requirements.

BRIEF DESCRIPTION OF THE SEVERAL VIEWS OF THE DRAWING(S)

DETAILED DESCRIPTION OF THE INVENTION

Figure 1:
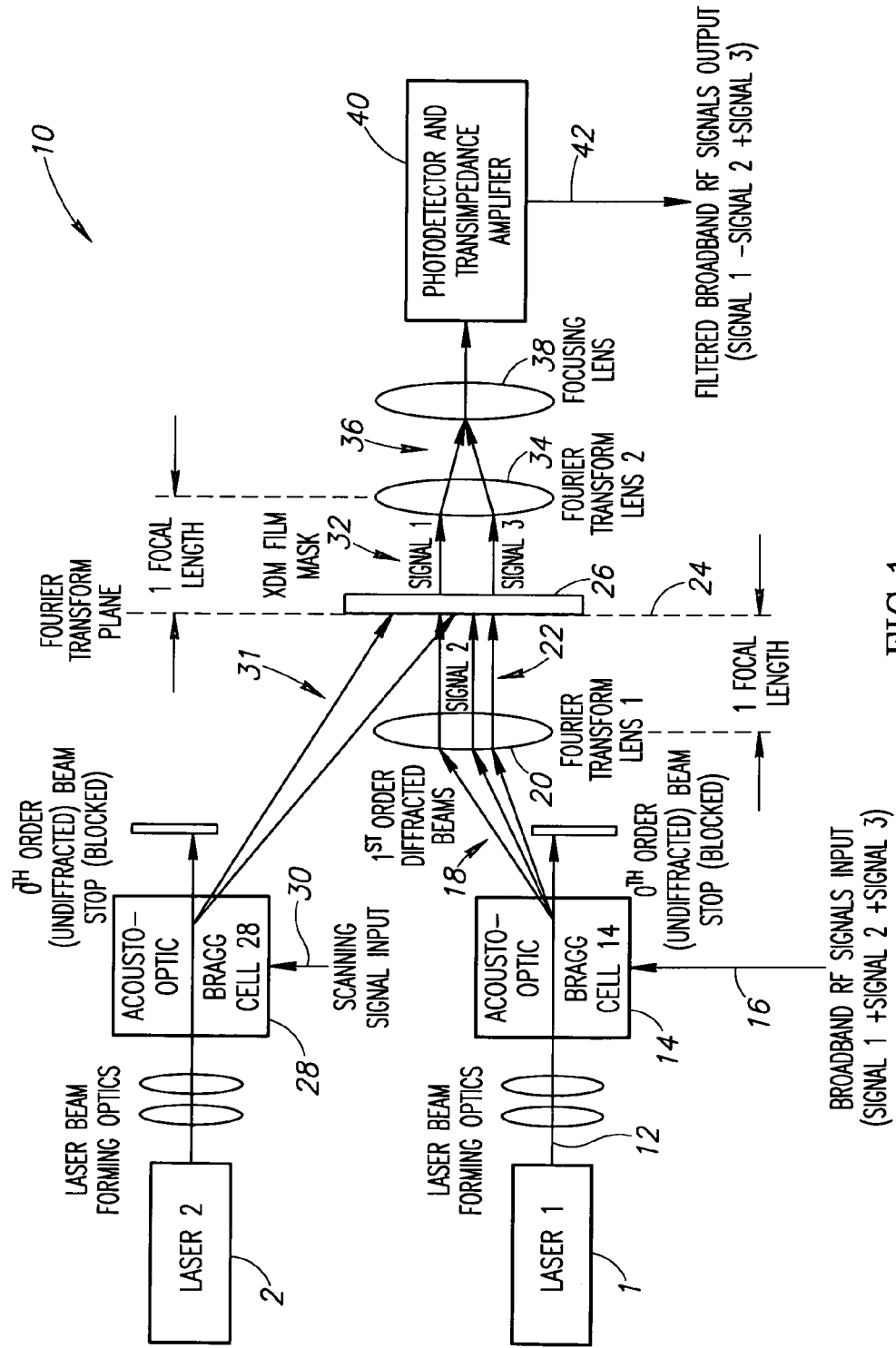
FIG. 1 is a schematic diagram of an adaptive wideband acousto-optic RF signal processing system in accordance with an embodiment of the present invention.

A coherent wideband acousto-optic RF spectrum analyzer 10 is shown in FIG. 1 in simplified form with a CW emitting LASER 1 providing an optical beam 12 of appropriate optical wavelength and intensity to be useful in the acousto-optic regime of a Bragg cell 14 used in the deflection mode. Incorporated herein by reference in its entirety is U.S. Pat. No. 5,146,358. A typical CW LASER appropriate for a Bragg cell deflector would be a GaAlAs semiconductor LASER diode operating at 820 nm optical (near-infrared) wavelengths. A typical wideband acousto-optic Bragg cell would be fabricated from GaP (isotropic diffraction), or LiNbO$_3$ (anisotropic diffraction) crystals, (both are man-made synthetic crystals).

An RF wideband signal 16 may be applied to the Bragg cell 14, resulting in a multitude of diffracted optical beams 18 to exit the Bragg cell at angles proportional to their respective RF frequencies, and at amplitudes proportional to their respective RF magnitudes. FIG. 1 depicts the RF signal 16 as comprising only three signals (signal 1, signal 2 and signal 3) for illustrative purposes, however, any number of signals may be applied to the Bragg cell 14 within the time-bandwidth product specification limit of the Bragg cell. The typical time-bandwidth products specification for Bragg cell deflectors is 2000.

The three signals comprising the illustrated RF signal 16 produce three first order diffracted optical beams 18, each first order diffracted optical beam corresponding to an RF signal present in the RF input spectrum of the RF signal 16, which are incident upon a Fourier Transform lens 20 and result in three optical signal beams 22 (corresponding to signals 1, 2 and 3 of the RF signal 16) which produce a Fourier Transform image (frequency plane distribution) in an image plane 24 beyond the Fourier Transform lens. The Fourier Transform lens 20 captures the first order diffracted optical beams 18 and then performs the complex Fourier Transform of the beams to create a one-dimensional line image of the frequency domain (RF spectrum) at the image plane 24 which is located one focal length behind the Fourier Transform lens.

An optically re-writable film 26, known as XDM (Xerox Dry Microfilm) that can rapidly accept an arbitrary optical distribution pattern, is placed in the image plane 24 to function as a mask. XDM is an electrophotographic material and is described in greater detail in U.S. Pat. Nos. 3,357,989; 3,542,545; 3,648,607; 3,671,282; 3,720,513; 3,816,118; 3,979,210; 3,982,936; 3,985,560; 4,013,462; 4,014,695; 4,028,101; 4,040,826; and 4,055,418, which are incorporated herein by reference in their entirety. The optical distribution pattern is written onto the XDM film 26 by a second accompanying CW emitting LASER 2 and a second accompanying Bragg deflector 28 operating at an optical wavelength appropriate for the XDM film to accept the desired pattern. Incorporated herein by reference in its entirety is U.S. Pat. No. 4,757,472. This optical wavelength should be different from the signal processing wavelength of LASER 1. The pattern created in the XDM film 26 is caused by an appropriate scanning signal 30 input into the second Bragg cell 28, to produce first order diffracted beams 31 which can scan over the dimensions of the Fourier Plane 24, and are amplitude modulated to expose the photosensitive XDM film resulting in a variable optical density pattern in the XDM film. The optical density is designed to be sufficiently great as to effectively attenuate the optical signal beams 22 of those portions of the RF signal 16 input spectrum that represent interfering signals (in the illustrated embodiment of FIG. 1, the attenuated optical signal beam corresponds to signal 2 of the RF signal 16).

Figure 2:
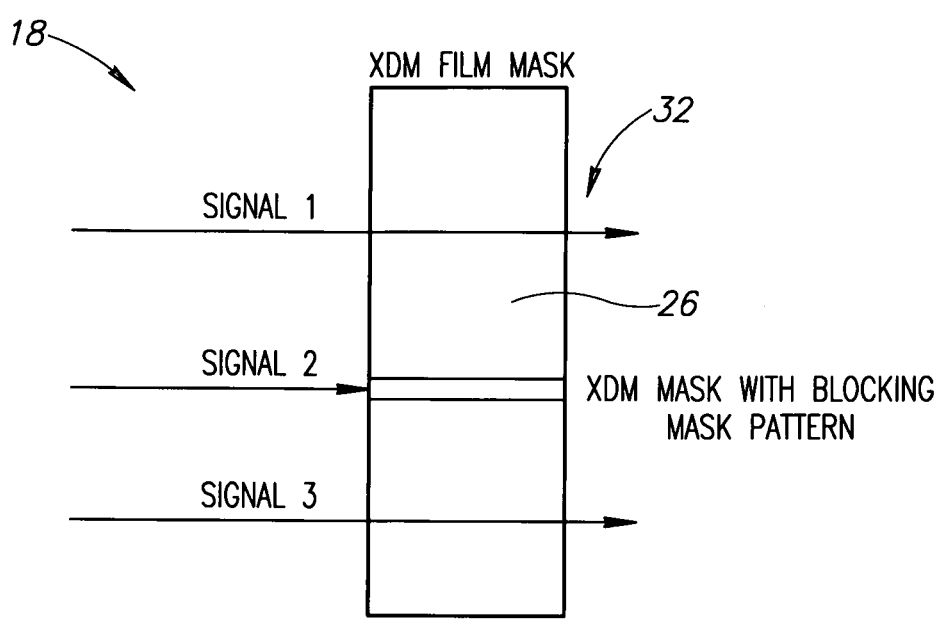
FIG. 2 is a schematic diagram of three illustrative signals incident upon an optically re-writable film with a blocking mask pattern blocking signal number 2.

The incident optical signal beams 22 encounter varying density regions in the XDM film 26. In the illustrated embodiment of the acousto-optic RF spectrum analyzer 10 shown in FIG. 1, signals 1, 2 and 3 of the RF signal 16 are input into the adaptive filtering system, but the signal beam corresponding to signal 2 of the RF signal 16 is blocked within the Fourier Plane 24 by the filtering pattern resident in the XDM film 26 and is not contained within a beam 32 resulting from the filtering by the XDM film. This is illustrated schematically in FIG. 2.

A second Fourier Transform lens 34 is located one focal length beyond the image plane 24 containing the XDM film 26 and has the beam 32 incident thereon. This second Fourier Transform lens 34 performs the inverse Fourier Transform of the filtered image plane to create a composite optical beam 36 that contains the filtered RF spectrum (signals 1 and 3 of the RF signal 16). Subsequent optical beam forming optics 38 shape and compress the composite beam to appropriate dimensions for a single photodetector and wideband transimpedance amplifier 40 to transduce the optical signals back to filtered electrical signals 42 which includes signals 1 and 3 of the input RF signal 16, but not signal 2. The XDM film 26 can also be optically erased and a new pattern re-written to create a new filtering function.

The optical pattern written into the XDM film 26 may be a simple blocking region or the pattern could be a diffractive optical element, e.g., holographic optical element (HOE), that performs more sophisticated optical transfer functions such as a diffractive lens that could re-focus and re-direct a portion of the Fourier Transform image in the image plane to another photodetector to monitor the parameters of the interfering signal, or could be a diffractive element that performs a signal transform of its own to perform additional signal processing functions, e.g., convolution and/or correlation functions, or additional transforms, e.g., Hilbert, Laplace, Chebychev, and Inverse Fourier Transforms.

The acousto-optic RF spectrum analyzer 10 illustrated in FIG. 1 uses a photosensitive, optically re-writable XDM film 26 that provides an adaptive spatial light filtering transform mask. The adaptive spatial light filtering mask can provide an adaptive filtering mechanism for use in an adaptive RF signal processing system, e.g., an adaptive RF interfering signal rejection filter, when used in conjunction with spatial light modulators. An acousto-optical Bragg cell operating in the Bragg deflector mode is an example of an appropriate spatial light modulator for RF signals.

This application discloses an adaptive RF signal processing system for processing an input RF signal, comprising: a spatial light modulator which receives the input RF signal and produces in response thereto a modulated light beam; and a photosensitive, optically writable medium positioned for filtering the modulated light beam. The photosensitive, optically writable medium may provide an adaptive spatial light filtering transform mask. The adaptive spatial light transform filtering mask may provide an adaptive RF interfering signal rejection filter. The spatial light modulator may include an acousto-optical Bragg cell operating in the Bragg deflector mode. The photosensitive, optically writable medium may be a re-writable film, and the film may be Xerox Dry Microfilm.

The adaptive RF signal processing system may be used with a pattern generator RF signal. In which case the system may include a pattern generator spatial light modulator which receives the pattern generator RF signal and produces in response thereto a modulated pattern generator light beam which is incident on the medium and creates an optical distribution pattern on the medium which functions as a mask to filter the modulated light beam.

The adaptive RF signal processing system may be used with a plurality of pattern generator RF signals, each selectable to generate a different corresponding optical distribution pattern on the medium, wherein the medium is a re-writable medium, and may further include a pattern generator spatial light modulator which receives the selected pattern generator RF signal and produces in response thereto a modulated pattern generator light beam which is incident on the medium to write the corresponding optical distribution pattern on the medium to function to filter the modulated light beam in accordance with the corresponding optical distribution pattern.

The adaptive RF signal processing system may further include a first Fourier Transform lens with the modulated light beam incident thereon and in response thereto producing an optical signal beam producing a Fourier Transform image in an image plane spaced apart from the Fourier Transform lens, the medium being positioned in the image plane and having the optical signal beam incident thereon, the medium having an optical distribution pattern to function as a mask to filter a selected portion of the RF spectrum of the optical signal beam and produce a filtered optical beam. The system may also include a second Fourier Transform lens with the filtered optical beam incident thereon and in response thereto performing an inverse Fourier Transform of the filtered optical beam incident thereon to product a composite optical beam containing the RF spectrum of the optical signal beam not filtered out. In addition, the system may further include optical beam forming optics to dimension the composite optical beam, and a photodetector to transduce the dimensioned composite optical beam into an RF output signal. The system may include a photodetector to transduce the composite optical beam into an RF output signal.

This application discloses coherent wideband acousto-optic RF spectrum analyzer for processing an input RF signal, comprising a first CW laser which provides a first laser beam, a first Bragg cell used in a deflection mode with the first laser beam incident thereon and receiving the input RF signal, and in response thereto producing multiple diffracted modulated light beams, a first Fourier Transform lens with the modulated light beams incident thereon and in response thereto producing optical signal beams producing a Fourier Transform image in an image plane spaced apart from the Fourier Transform lens, and a photosensitive, optically re-writable medium positioned in the image plane with the optical signal beams incident thereon, the medium having an optical distribution pattern to function as a mask to attenuate a selected portion of the RF spectrum of the optical signal beams and produce an attenuated optical beam. The analyzer may further include a second Fourier Transform lens with the attenuated optical beam incident thereon and in response thereto performing an inverse Fourier Transform of the attenuated optical beam incident thereon to product a composite optical beam containing the unattenuated RF spectrum of the optical signal beams. And may also include optical beam forming optics to dimension the composite optical beam, and a photodetector to transduce the dimensioned composite optical beam into an RF output signal. The analyzer may further include a photodetector to transduce the composite optical beam into an RF output signal.

The analyzer may be used use with a pattern generator RF signal selected to generate the optical distribution pattern on the medium to function as the mask, and may further include a second CW laser which provides a second laser beam; and a second Bragg cell with the laser beam incident thereon and receiving the pattern generator RF signal, and in response thereto producing multiple diffracted modulate light beams which are incident on the medium to create the optical distribution pattern on the medium which functions as the mask.

The analyzer may be used with a plurality of pattern generator RF signals, each selectable to generate a different corresponding optical distribution pattern on the medium to function as the mask, and may further include: a second CW laser which provides a second laser beam; and a second Bragg cell with the laser beam incident thereon and receiving the selected pattern generator RF signal, and in response thereto producing multiple diffracted modulate light beams which are incident on the medium to write the corresponding optical distribution pattern on the medium which functions as the mask to attenuate a selected portion of the RF spectrum of the optical signal beams in accordance with the corresponding optical distribution pattern.

The foregoing described embodiment depicts different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While a particular embodiment of the present invention has been illustrated and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A coherent wideband acousto-optic RF spectrum analyzer for processing an input RF signal, comprising:
 a first CW laser which provides a first laser beam;
 a first Bragg cell used in a deflection mode with the first laser beam incident thereon and receiving the input RF signal, and in response thereto producing multiple diffracted modulated light beams;
 a first Fourier Transform lens with the modulated light beams incident thereon and in response thereto producing optical signal beams producing a Fourier Transform image in an image plane spaced apart from the Fourier Transform lens;

a photosensitive, optically re-writable medium positioned in the image plane with the optical signal beams incident thereon, the medium having an optical distribution pattern to function as a mask to attenuate a selected portion of the RF spectrum of the optical signal beams and produce an attenuated optical beam;

a second Fourier Transform lens with the attenuated optical beam incident thereon and in response thereto performing an inverse Fourier Transform of the attenuated optical beam incident thereon to product a composite optical beam containing the unattenuated RF spectrum of the optical signal beams; and wherein the acousto-optic RF spectrum analyzer is for use with a plurality of pattern generator RF signals, each selectable to generate a different corresponding optical distribution pattern on the medium to function as the mask, and further includes:

a second CW laser which provides a second laser beam; and a second Bragg cell with the laser beam incident thereon and receiving the selected pattern generator RF signal, and in response thereto producing multiple diffracted modulate light beams which are incident on the medium to write the corresponding optical distribution pattern on the medium which functions as the mask to attenuate a selected portion of the RF spectrum of the optical signal beams in accordance with the corresponding optical distribution pattern.

2. The acousto-optic RF spectrum analyzer of claim 1, further including optical beam forming optics to dimension the composite optical beam, and a photodetector to transduce the dimensioned composite optical beam into an RF output signal.

3. The acousto-optic RF spectrum analyzer of claim 1, further including a photodetector to transduce the composite optical beam into an RF output signal.

4. The acousto-optic RF spectrum analyzer of claim 1 for use with a pattern generator RF signal selected to generate the optical distribution pattern on the medium to function as the mask, further including:

a second CW laser which provides a second laser beam; and a second Bragg cell with the laser beam incident thereon and receiving the pattern generator RF signal, and in response thereto producing multiple diffracted modulate light beams which are incident on the medium to create the optical distribution pattern on the medium which functions as the mask.

5. The acousto-optic RF spectrum analyzer of claim 1 wherein the photosensitive, optically re-writable medium provides an adaptive spatial light filtering transform mask.

6. The acousto-optic RF spectrum analyzer of claim 5 wherein the adaptive spatial light transform filtering mask provides an adaptive RF interfering signal rejection filter.

7. The acousto-optic RF spectrum analyzer of claim 1 wherein the photosensitive, optically writable medium is a re-writable film.

8. The acousto-optic RF spectrum analyzer of claim 7 wherein the re-writable film is Xerox Dry Microfilm.

9. The acousto-optic RF spectrum analyzer of claim 1 for use with a pattern generator RF signal, further including:

a pattern generator spatial light modulator which receives the pattern generator RF signal and produces in response thereto a modulated pattern generator light beam which is incident on the medium and creates the optical distribution pattern on the medium which functions as a mask to filter the modulated light beam.

10. The acousto-optic RF spectrum analyzer of claim 1 for use with a plurality of pattern generator RF signals, each selectable to generate a different corresponding optical distribution pattern on the medium, and further including a pattern generator spatial light modulator which receives the selected pattern generator RF signal and produces in response thereto a modulated pattern generator light beam which is incident on the medium to write the corresponding optical distribution pattern on the medium to function to filter the modulated light beam in accordance with the corresponding optical distribution pattern.

11. The acousto-optic RF spectrum analyzer of claim 1, wherein the medium having the optical distribution pattern to functions as a mask to filter a selected portion of the RF spectrum of the optical signal beams and produce a filtered optical beam.

12. The acousto-optic RF spectrum analyzer of claim 11, further including a second Fourier Transform lens with the filtered optical beam incident thereon and in response thereto performing an inverse Fourier Transform of the filtered optical beam incident thereon to product a composite optical beam containing the RF spectrum of the optical signal beam not filtered out.

13. The acousto-optic RF spectrum analyzer of claim 12, further including optical beam forming optics to dimension the composite optical beam, and a photodetector to transduce the dimensioned composite optical beam into an RF output signal.

14. The acousto-optic RF spectrum analyzer of claim 12, further including a photodetector to transduce the composite optical beam into an RF output signal.

* * * * *